(12) United States Patent
Veggetti et al.

(10) Patent No.: US 8,570,085 B2
(45) Date of Patent: Oct. 29, 2013

(54) LOW CONSUMPTION FLIP-FLOP CIRCUIT WITH DATA RETENTION AND METHOD THEREOF

(71) Applicants: STMicroelectronics S.r.l., Agrate Brianza (IT); STMicroelectronics International NV, Amsterdam (NL)

(72) Inventors: Andrea Mario Veggetti, Agrate Brianza (IT); Abhishek Jain, Delhi (IN); Pankaj Rohilla, New Delhi (IN)

(73) Assignees: STMicroelectronics S.r.l., Agrate Brianza (IT); STMicroelectronics International NV, Amsterdam (NL)

( * ) Notice: Subject to any disclaimer, the term of this patent is extended or adjusted under 35 U.S.C. 154(b) by 0 days.

(21) Appl. No.: 13/689,476

(22) Filed: Nov. 29, 2012

(65) Prior Publication Data

US 2013/0088272 A1     Apr. 11, 2013

Related U.S. Application Data

(63) Continuation of application No. 13/008,588, filed on Jan. 18, 2011, now Pat. No. 8,330,518.

(30) Foreign Application Priority Data

Jan. 18, 2010   (IT) .............................. BS2010A0005

(51) Int. Cl.
   *H03K 3/289*   (2006.01)
   *H03K 3/356*   (2006.01)
(52) U.S. Cl.
   USPC ............ 327/202; 327/203; 327/208; 327/218
(58) Field of Classification Search
   None
   See application file for complete search history.

(56) References Cited

U.S. PATENT DOCUMENTS

| | | | |
|---|---|---|---|
| 6,762,638 B2 * | 7/2004 | Correale et al. ............... | 327/202 |
| 6,775,180 B2 | 8/2004 | Biyani et al. | |
| 6,850,103 B2 * | 2/2005 | Ikeno et al. .................... | 327/202 |
| 7,138,842 B2 | 11/2006 | Padhye et al. | |
| 7,183,825 B2 * | 2/2007 | Padhye et al. .................. | 327/202 |
| 7,577,858 B2 * | 8/2009 | Garg et al. ...................... | 713/320 |
| 7,583,121 B2 | 9/2009 | Berzins et al. | |
| 7,610,572 B2 | 10/2009 | Kanno et al. | |
| 7,652,513 B2 * | 1/2010 | Rao et al. ........................ | 327/203 |
| 7,710,177 B2 * | 5/2010 | Hoover .......................... | 327/218 |
| 7,791,389 B2 | 9/2010 | Remington | |
| 7,961,502 B2 * | 6/2011 | Chua-Eoan .................... | 365/158 |
| 2003/0188241 A1 | 10/2003 | Zyuban et al. | |
| 2006/0192604 A1 * | 8/2006 | Ramaraju et al. ............. | 327/199 |
| 2006/0192704 A1 | 8/2006 | Han et al. | |
| 2006/0267654 A1 | 11/2006 | Gururajarao et al. | |
| 2009/0058486 A1 * | 3/2009 | Ozawa et al. .................. | 327/203 |
| 2009/0066385 A1 | 3/2009 | Hoover | |
| 2009/0189664 A1 * | 7/2009 | Remington .................... | 327/202 |
| 2009/0326854 A1 * | 12/2009 | Chakravadhanula et al. | 702/119 |
| 2010/0141322 A1 | 6/2010 | Chua-Eoan | |

* cited by examiner

*Primary Examiner* — Tuan T Lam
(74) *Attorney, Agent, or Firm* — Seed IP Law Group PLLC (57) ABSTRACT

The present disclosure relates to a low consumption flip-flop circuit with data retention, comprising at least one flip-flop and at least one retention cell connected to the output of the flip-flop and configured so that during normal operation of the flip-flop circuit, the retention cell transmits the data or logic state present on the output terminal of the flip-flop to its own output terminal, while during low consumption operation of the flip-flop circuit a latch circuit of the retention cell suitable to memorize data or a logic state corresponding to the last data or logic state present on the output terminal of the flip-flop is activated.

25 Claims, 5 Drawing Sheets

| Parameters | Basic Flip-flop Based | Retention Flip-flop Based | Scan Retention Mechanism (proposed methodology) | |
|---|---|---|---|---|
| | | | With Normal Std. Cell Lib. | With Specific Retention cells |
| Leakage | X | Y (Y<<X, in power down mode) (13 HVT MOS Transistors per flip-flop) | 2Y (~15 HVT MOS transistors) | 0.5Y (8 HVT MOS Transistors) |
| CP-Q Delay | D | 1.2D | D | D |
| Dynamic Power | P | 1.2P | 1.02P | 1.02P |
| Area | A | 1.6A | 1.75A | ~1.6A |
| Implementation Overhead | None | Medium | High | High |
| Designing Overhead | None | High | None | High |

LOW CONSUMPTION FLIP-FLOP CIRCUIT WITH DATA RETENTION AND METHOD THEREOF

This application is a Continuation of U.S. application Ser. No. 13/008,588, filed Jan. 18, 2011, now U.S. Pat. No. 8,330,518, which is herein incorporated by reference in its entirety.

BACKGROUND

1. Technical Field

The present disclosure relates to the field of integrated electronic circuits, and in particular circuits comprising at least one flip-flop. For example, the present disclosure can be used to advantage in the production of shift registers, which include a cascade connection of numerous flip-flops.

2. Description of the Related Art

As is known, even when integrated circuits are in low consumption or standby mode, there is any case a static consumption which accounts for a significant share of the total energy consumption of an electronic device. This drawback has been exacerbated by the exaggerated miniaturization of electronic components and by the high performance desired. The need therefore exists to reduce static energy consumption as much as possible when the device is in standby mode.

One of the proposed solutions is based on the use of retention flip-flops wherein the flip-flop retains the data inside it in a special latch circuit. Such circuits use two types of transistors: a first type of transistor, used for normal flip-flop operation, with a standard voltage threshold (SVT), and therefore very fast; a second type of transistor, used for operation when the circuit is in low consumption mode and with a high voltage threshold (HVT), thus with very low static consumption. The transistors of the first type and the second type are powered by independent supply voltages, so that in low consumption mode, only the transistors used for data memorization which are in case of the HVT type, remain powered.

Such solution therefore sets out to combine high dynamic performance with low static consumption.

One example of this type of flip-flop is described for instance in U.S. Pat. No. 7,138,842 B2.

However, the data retention function uses dedicated circuitry and dedicated signal control logic which controls the switchover between normal operation and the low consumption mode. With a reduced static consumption, this entails a greater dynamic consumption compared to traditional flip-flops, due to the addition of transistors, and, in some cases, reduced performance, in particular of the parameters dependent on the speed of the flip-flop.

Another solution, described for example in WO2006/127888, attempts to resolve the drawbacks of the retention flip-flops described above by taking the clock signal as the stand-by command signal and memorizing the data in a latch slave without modifying the structure of the flip-flop. In this case however there is the disadvantage of more complicated clock signal management.

BRIEF SUMMARY

One embodiment exploits the advantages of retention flip-flops, in particular a very low static consumption, without however negatively affecting other characteristics of the flip-flop circuit, such as speed and dynamic consumption.

One embodiment of the present disclosure is a flip-flop circuit which operates using a technique based on data retention and which therefore enables memorization of the data in the low consumption operation mode and recovery of the data at the end of stand-by. The flip-flop circuit can then function normally, and at the same time enable improved performance in terms of speed, energy consumption during normal operation and static consumption in stand-by compared to the retention flip-flops of the known art.

BRIEF DESCRIPTION OF THE SEVERAL VIEWS OF THE DRAWINGS

The characteristics and advantages of the electronic circuit according to the disclosure will be evident from the description below made by way of a non-limiting example of its preferred embodiments with reference to the attached figures, wherein.

DETAILED DESCRIPTION

Figure 1:
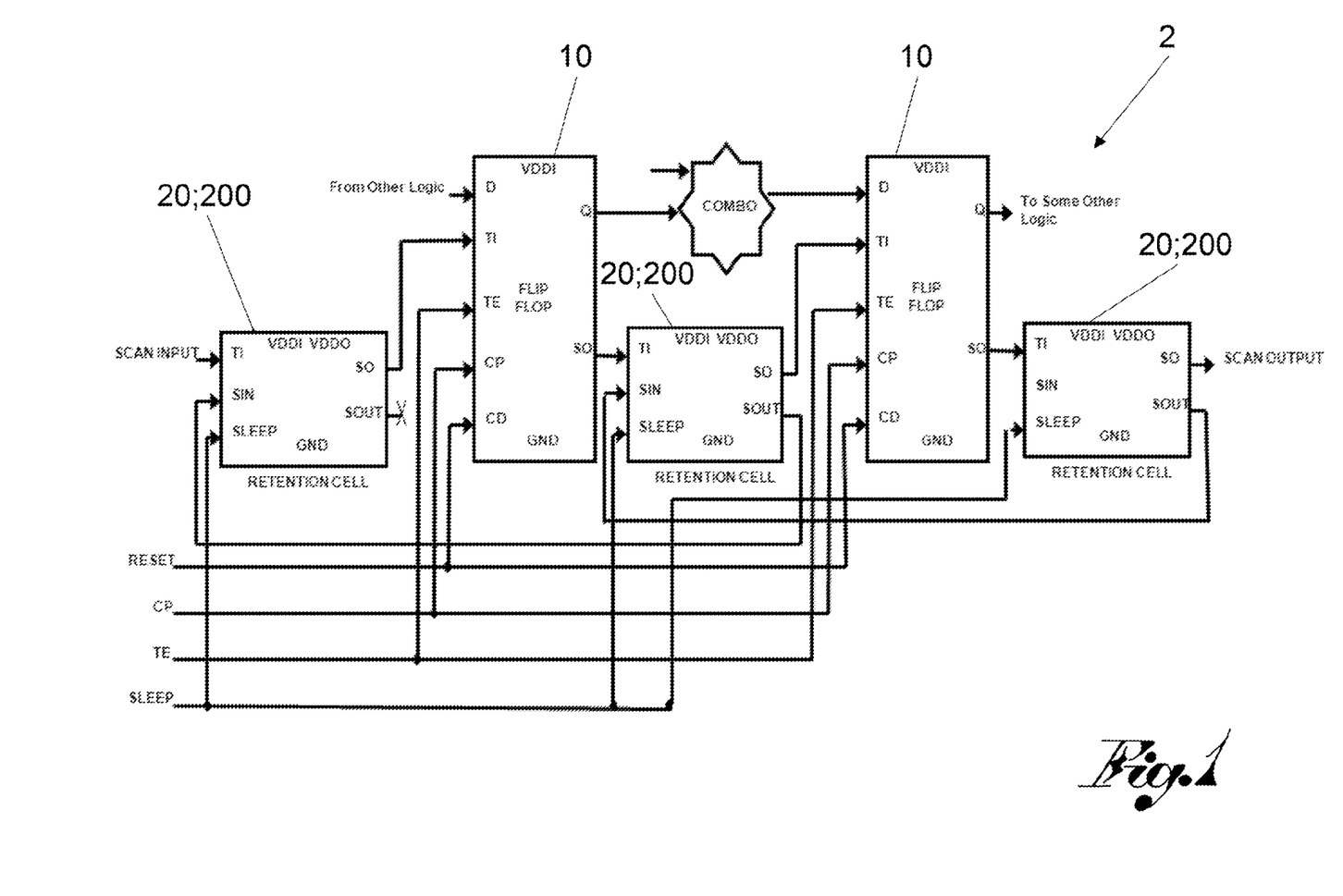
FIG. 1 shows a block circuit diagram of the flip-flop circuit according to the disclosure.

In one general embodiment, shown in FIG. 1 and globally denoted by reference numeral 2, a low consumption flip-flop circuit with data retention according to the disclosure comprises at least one flip-flop 10 having at least one input terminal D to receive a logic state, a first output terminal Q to supply an output data, a second output terminal SO which assumes the same value as the first output terminal, and a supply terminal VDDI to receive a first supply voltage VDDI. As used herein, "logic state" is intended to include any digital value, such as a datum, control value, programming value, signal value, etc.

In one embodiment, during normal operation mode, the flip-flop 10 transmits the data on the input terminal D to the output terminals Q and SO during the changing of the state (for example the leading edge) of a clock signal, for example from low to high. To such purpose, the circuit comprises a CP line for the clock signal which is brought to each flip-flop 10.

The circuit 2 comprises, in addition, a retention cell 20; 200 having a first input terminal TI connected to the second output terminal SO of the flip-flop, a second input terminal SLEEP to receive a low consumption command, or a command which controls the passage of the circuit from the normal operation to the low consumption, or stand-by mode, and vice versa, a first supply terminal VDDI to receive a first supply voltage, a second supply terminal VDDO to receive a second supply voltage controllable independently of the first, a first output terminal SO and a second output terminal SOUT.

In one embodiment, the flip-flop circuit 2 includes just one flip-flop 10 and just one retention cell 20; 200. In other embodiments, the flip-flop circuit 10 includes a cascade of flip-flops 10 and retention cells 20; 200 as shown in FIG. 1.

The retention cell 20; 200 has, in addition, a third input terminal SIN connectable to the second output terminal SOUT of a retention cell immediately downline in the circuit 2, which includes several flip-flops connected in cascade, as will be better described below, wherein a respective retention cell 20; 200 is connected to the output of each flip-flop.

In other words, a retention cell 20; 200 is connected to the output of a respective flip-flop 10 so as to be separate from said flip-flop and not to alter the inner structure of the flip-flop 10.

In this description the terms "connected", "operatively connected", "linked up", etc. are used, save as otherwise indicated, in an equivalent manner to indicate not just a direct electrical connection between at least two elements of a circuit, but also a connection between said elements with the interposition of a circuit, for example a logic circuit, which somehow alters the state of a signal or data transmitted by one of said elements to another.

The retention cell 20; 200 is configured so that during normal operation of the flip-flop circuit 2, the retention cell 20; 200 transmits to its output terminal SO the logic state of the signal or data present on the first input terminal TI, that is on the second output terminal SO of the flip-flop 10. In other words, in such operation mode the retention cell may be defined as "transparent" in relation to the behavior of the flip-flop 10, in the sense that the same data present on the first output terminal Q of the flip-flop 10 is present on the output terminal SO of the retention cell.

As a result, the presence of the retention cell does not influence the performance, in particular the speed, of the flip-flop.

Figure 4:
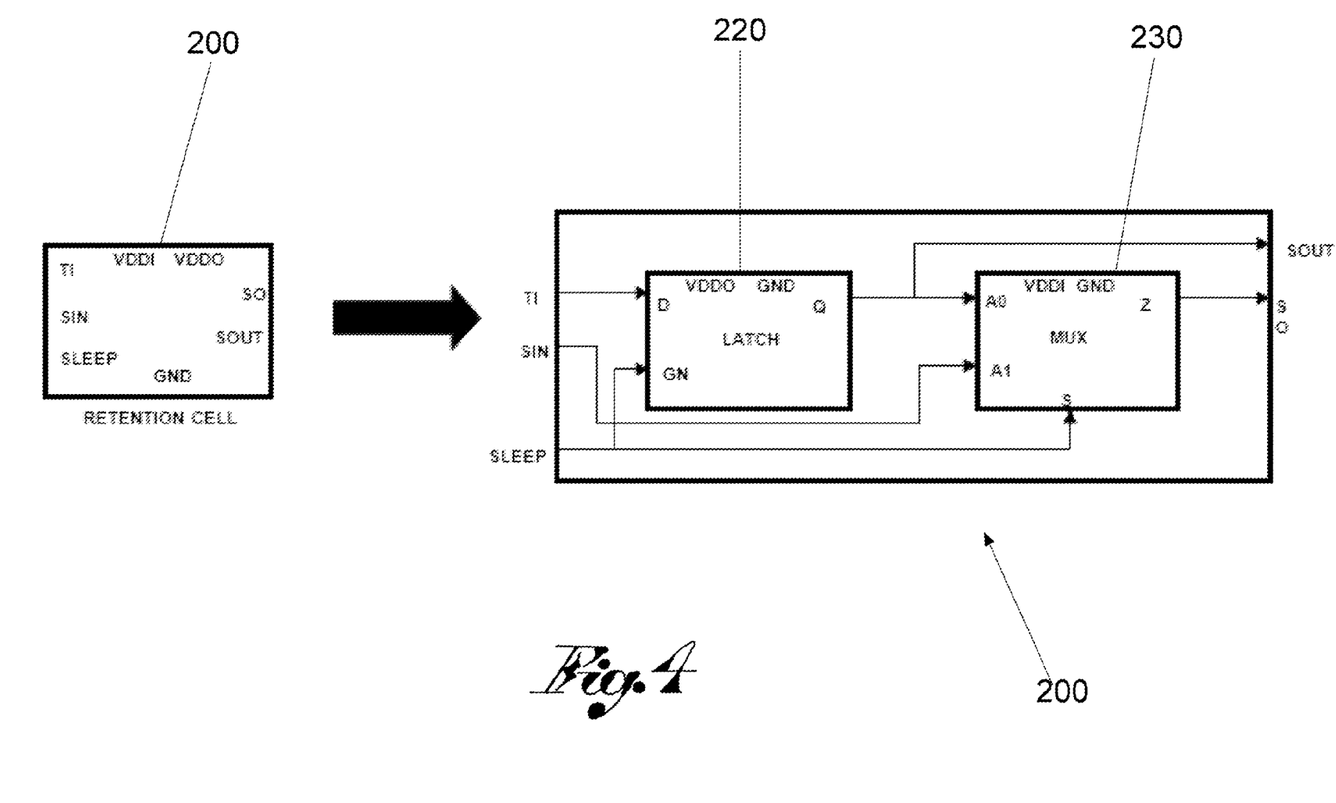
FIG. 4 is a block diagram of the retention cell in one embodiment variation.

In response to activation of the low consumption command signal SLEEP (for example SLEEP=1), the flip-flop circuit goes into the low consumption or stand-by mode in which the first supply voltage VDDI is removed. In addition, the SLEEP signal activates a latch circuit 22; 220 (FIGS. 2; 4) of the retention cell 20; 200 powered by the second supply voltage VDDO and suitable to memorize the logic state corresponding to the last logic state present on the first and second output terminal of the flip-flop, in other words the last logic state loaded in the retention cell.

Figure 2:
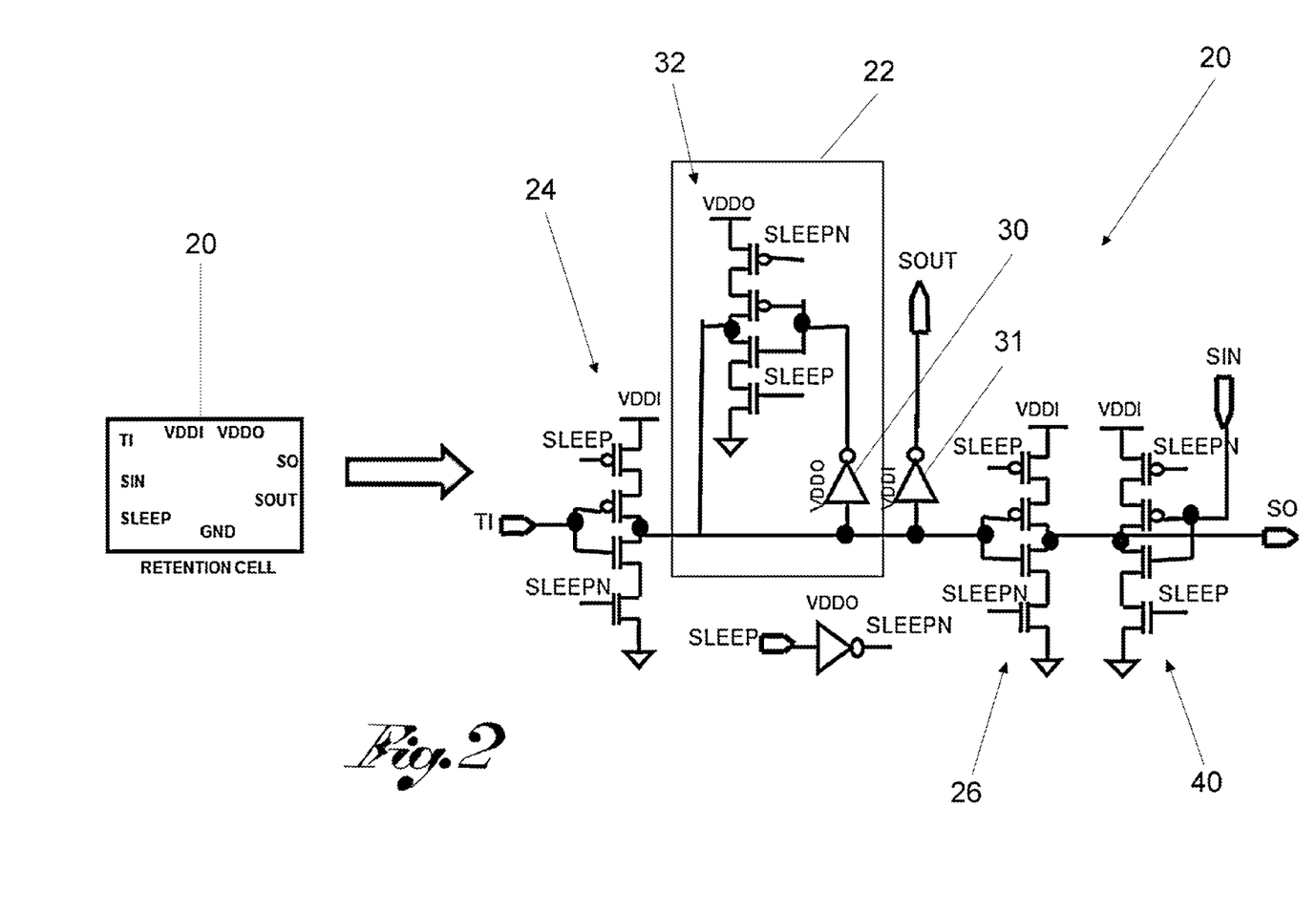
FIG. 2 shows a circuit diagram of a retention cell, in a first embodiment.

Upon return to normal operation mode (for example SLEEP=0), the data or logic state memorized is present on the second output terminal SOUT of the retention cell 20; 200, connected to the SIN input of the retention cell immediately upline, which at that point transfers it to its output SO. The data memorized is thus ready to be used during normal operation of the circuit in that the output SO of the cell is directly connected to the input of the flip-flop (TI) to which such data "belonged" before stand-by.

In other words, at the moment of activation of the low consumption command SLEEP, the last data present on the output of a flip-flop is loaded in the retention cell connected to said output and memorized by the latch circuit 22; 220 of said retention cell until subsequent deactivation of the low consumption command. Following such deactivation, and therefore the return of the circuit to the normal operation mode, the data memorized is carried back to the input of the flip-flop on the output of which it was present at the moment of stand-by.

In one embodiment, the flip-flop circuit 2 according to the disclosure is an integrated circuit that includes a large number of flip-flops connected to each other in cascade, for example for the realization of shift registers. In another embodiment, the flip-flop circuit 2 is an integrated circuit that includes a series of flip-flops connected to each other by a "scan chain" enabling verification of the correct operation of the chain of flip-flops. The scan chain includes respective retention cells 20; 200 positioned between two consecutive flip-flops in the chain, and uses the input TI, TE and output terminals SO of the flip-flop.

More in detail and again with reference to FIG. 1, the circuit 2 comprises flip-flops 10 connected to each other in cascade so that the first input terminal D of a subsequent flip-flop, or downline flip-flop in the chain, is operatively connected to the first output terminal Q of a previous flip-flop, or upline flip-flop in the chain. In addition, each flip-flop 10 comprises a second input terminal TI to receive a scan signal, and a third input terminal TE to receive an enabling signal of transmission of the scan signal present on the second input terminal TI to the first output terminal Q. Each retention cell 20; 200 is inserted between two consecutive flip-flops so that the output terminal SO of the cell is connected to the second input terminal TI of the subsequent flip-flop.

FIG. 1 shows an example of a circuit with two flip-flops 10 connected in cascade, at the output of each of which a retention cell 20; 200 is connected. In addition, at the input of the first flip-flop of the series of two flip-flops a retention cell is connected which has its second input terminal SIN connected to the output terminal SOUT and the first input terminal TI suitable to receive a SCAN INPUT signal to verify correct operation of the flip-flop circuit. The second output terminal SOUT of this retention cell is not used.

The retention cell connected to the output of the second and last flip-flop supplies on its first output terminal SO an output signal SCAN OUTPUT which represents the data in output to the chain of flip-flops and therefore indicates correct operation, the SCAN INPUT signal being known.

The input terminals for the enabling signal TE of all the flip-flops are connected to an external line of an enabling signal TE, coming from a controller, similarly to the clock signal, the SLEEP signal and any RESET signal.

In one embodiment shown in FIG. 2, the retention cell 20 is designed to reduce the number of transistors and therefore static consumption and occupied area to a minimum. In such embodiment, the cell 20 comprises a first transmission port 24 having an input terminal connected to the first input terminal TI of the cell and an output terminal connected to the latch circuit 22 of the cell. Between the latch circuit 22 and the output SO of the cell a second transmission port 26 is interposed having an input terminal connected to the latch circuit 22 and an output terminal connected to the first output terminal SO of the cell.

The second input terminal SIN is connected to the first output terminal SO by a third transmission port 40.

Said first, second and third transmission ports 24, 26 and 40 are powered by the first supply voltage VDDI and are controlled by the low consumption command signal SLEEP so as to switchover from a state of normal operation, wherein the data present on the input terminal of the port is transmitted on the output terminal of the port, to a low consumption operation mode, wherein the port is not powered by the first supply voltage VDDI and has a high impedance which impedes said transmission of the data.

The second output terminal SOUT is connected to the latch circuit 22 through a logic port "NOT" 31 powered by the first supply voltage VDDI.

In one embodiment, in a normal operation state, the transmission ports 24, 26, 40 form the logic operator "NOT", in other words transmit in negated form to the output the data present on their input.

In one embodiment, the latch circuit 22 of the retention cell 20 comprises, connected in series to each other, a "NOT" port 30 powered by the second supply voltage VDDO and a transmission port 32 powered by the second supply voltage VDDO and controlled by the low consumption command signal SLEEP so as to witch from a conductive state, corresponding to the low consumption operation mode, wherein the data on the input terminal of the port 32 is transmitted negated on the output terminal of the port, and a state of high impedance, corresponding to the normal operation mode of the circuit.

As a result, when the circuit is in the normal operation mode, the latch circuit 22 does not work since the transmission port 32 controlled by the SLEEP signal is in a state of high impedance, while the transmission ports 24, 26 are in a conductive state and transmit the data on the cell input to the cell output, end then on the second input terminal TI of the flip-flop downline of the retention cell. Since the enabling signal TE is not activated, the data on said input TI is not however transmitted on the output Q of the flip-flop, the output of which rather receives the data present on the first input terminal D of the flip-flop.

When the circuit changes to low consumption mode, the two transmission ports 24, 26 of the cell 20 assume a state of high impedance, while the latch circuit 22 is activated and in practice implements the connection in series of two "NOT" ports. Such circuit 22 memorizes the last data loaded in the cell, that is the data present on the output terminal of the first transmission port 24 and therefore on the input terminal of the second transmission port 26.

Upon return of the circuit to normal operation mode, the first supply voltage VDDI is restored before deactivation of the low consumption SLEEP signal. Then, the data memorized is present on the output SOUT of the retention cell and is contemporarily carried on the input SIN of the retention cell upline, which upon deactivation of the low consumption signal, can transfer it directly to its output SO, and from here to the second input terminal TI of the flip-flop upline of the cell which had memorized the data. By activating the enabling signal TE and the clock signal, such data is transmitted on the output terminal Q of the flip-flop. At this point, the enabling signal can be deactivated and the chain of flip-flops resumes its normal operation "D-Q".

Getting back to the implementation aspects of the retention cell 20 illustrated in FIG. 2, each transmission port 24, 26, 32, 40 of the cell comprises a connection in series of a P-MOS transistor and of a N-MOS transistor so as to form the series of a network of "Pull-Up" and a network of "Pull-Down". The P-MOS transistor is connected to the supply voltage VDDI; VDDO by a further P-MOS transistor controlled by the low consumption command signal SLEEP; the N-MOS transistor is connected to the voltage corresponding to the zero logic by a further N-MOS transistor controlled by the low consumption negated command signal SLEEPN. Advantageously, the transistors of the transmission ports 24, 26, 40 powered by the first supply voltage VDDI have a standard voltage threshold (SVT) and are therefore very fast, while the transistors of the transmission ports 30, 32 powered by the second supply voltage VDDO have a high voltage threshold (HVT), and therefore very low static consumption.

Advantageously, during scan or debug operation enabling verification of the correct operation of the chain of flip-flops, the retention cell is completely transparent in that its input TI and its output SO are directly connected (SLEEP=0) and therefore the data present on the output SO of the flip-flop is directly connected to the input TI of the subsequent flip-flop.

Figure 3:
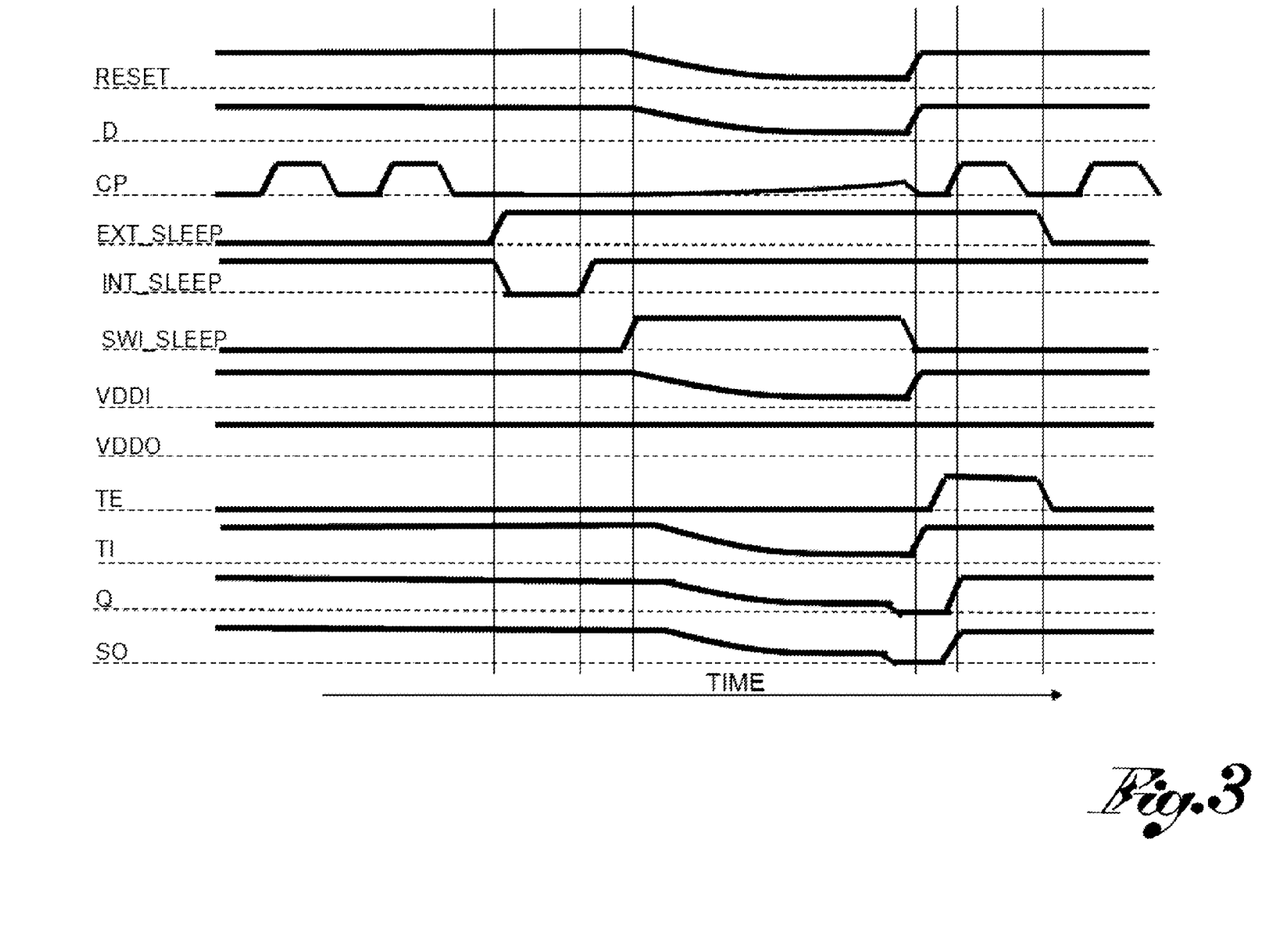
FIG. 3 shows a timing diagram of the various signals of the circuit in the previous figures.

FIG. 3 shows a temporal diagram of the wave shapes of the signals involved in the operation of the flip-flop circuit described above.

The following are shown in particular:
a signal relative to the data present on the input terminal D of a flip-flop, for example having the logic state "1" up to interruption of the power supply VDDI;
the clock signal;
the low consumption signal (EXT_SLEEP);
the two signals of the power supply voltages VDDI and VDDO, the latter always active;
the enabling signal TE;
the signal on the input terminal TI of the cell;
the signal on the output terminal Q of the flip-flop; and
the signal on the output terminal SO of the retention cell.

One may observe how, to avoid metastability phenomena of the transistors, when entering the low consumption mode, first the SLEEP signal is activated, then the first supply voltage VDDI is interrupted.

When returning to normal operation, first the supply voltage VDDI is restored, then the enabling signal TE, then the clock signal. Lastly the SLEEP signal and the enabling signal TE are deactivated.

In one embodiment variation shown in FIG. 4, the retention cell 200 is advantageously made using standard devices already available to the integrated circuitry designer. On the other hand such standardization entails the use of a greater number of transistors and therefore a slightly higher consumption and a slightly larger occupied area, as will be pointed out in more detail below.

Each retention cell 200 comprises a latch 220 powered by the second supply voltage VDDO and a multiplexer 230 with two inputs A0, A1 and a selection line S. The multiplexer 230 is powered by the first supply voltage VDDI.

As in the previous case, the retention cell 200 has, as well as the power supply terminals VDDI, VDDO and connection to the relevant voltage for the zero logic GND, a first input terminal TI, connected to the second output terminal SO of the flip-flip 10, a second input terminal SLEEP to receive the low consumption command signal, a third input terminal SIN, a first output terminal SO, connected to the second input terminal TI of the flip-flop 10 downline of the cell, and a second output terminal SOUT.

More specifically, the latch 220 has a first input terminal D, corresponding or connected to the first input terminal TI of the cell, therefore connected to the second output terminal SO of the first flip-flop 10, a second input terminal GN to receive the low consumption command signal SLEEP as the enabling signal of the latch, and an output terminal Q. Said output terminal Q of the latch 220 constitutes the first input A0 of the multiplexer 230 and is also carried on the second output SOUT of the cell 200.

The multiplexer 230 therefore has a first input terminal A0 connected to the output terminal Q of the latch 220 and a second input terminal A1 connected to the second input terminal SIN of the cell, which in turn is connected to the second output terminal SOUT of the subsequent cell.

The multiplexer 230 has, in addition, a selection terminal S to receive the low consumption command signal SLEEP as a selection signal, and an output terminal Z which corresponds to or is connected to the first output terminal SO of the cell.

In the normal operation mode of the circuit, the latch 220 transmits the logic state of the data present on the output terminal SO of the first flip-flop to its output terminal Q and the multiplexer transmits the logic state of the data present on its own first input terminal A0 to its output signal Z.

In the low consumption mode, the latch 220 memorizes the logic state of the last data present on the output terminal of the first flip-flop, while the multiplexer 230 is turned off inasmuch as connected to the VDDI power supply, preventing unwanted consumption.

The output signal of the latch, present therefore on the second output terminal SOUT of the cell, is connected in this case too to the SIN input of the retention cell upline. In this case too, before disabling the SLEEP signal the power supply to the VDDI is restored and the multiplexer of said upline cell, being activated, carries the data present on the input SIN towards its output SO, connected to the input TI of the flip-flop. The SLEEP (=0) signal is then disabled and the input TE of the flip-flop being enabled, the data present on the second input terminal TI is loaded and the flip-flop thus returned to the configuration it had before entering the low consumption mode.

In any case the temporal sequence of the signals in the phase passing from normal operation mode to low consumption mode and vice versa is the same as that described above for the retention cell in the first embodiment.

In both embodiments, the scan path between the flip-flops, already provided in a widely used type of flip-flop connected in cascade, is used to keep the data in the low consumption mode, without altering the functional path of the circuit. In other words, the circuital retention structure of the data is transferred from the functional part of the circuit to the scan part of the circuit.

In addition, the insertion of the retention cell in the scan path makes it possible to prevent violation of the hold time of the flip-flop which occurs rather in the circuital architectures in which the scan output (SO) of a flip-flop is sent directly to the scan input (TI) of the flip-flop. In fact, despite being transparent, the retention cell adds a slight delay to the propagation of the SO signal of the flip flop upline towards the TI input of the downline flip-flop, normally directly connected and without logic circuits. In this case rather, thanks to the slight delay introduced by the retention cell in propagating the signal on the output terminal SO of a flip-flop towards the input terminal TI of the subsequent flip-flop, one is sure that the data on said TI terminal is always stable in the immediate vicinity of the switch of the clock signal.

Figure 5:
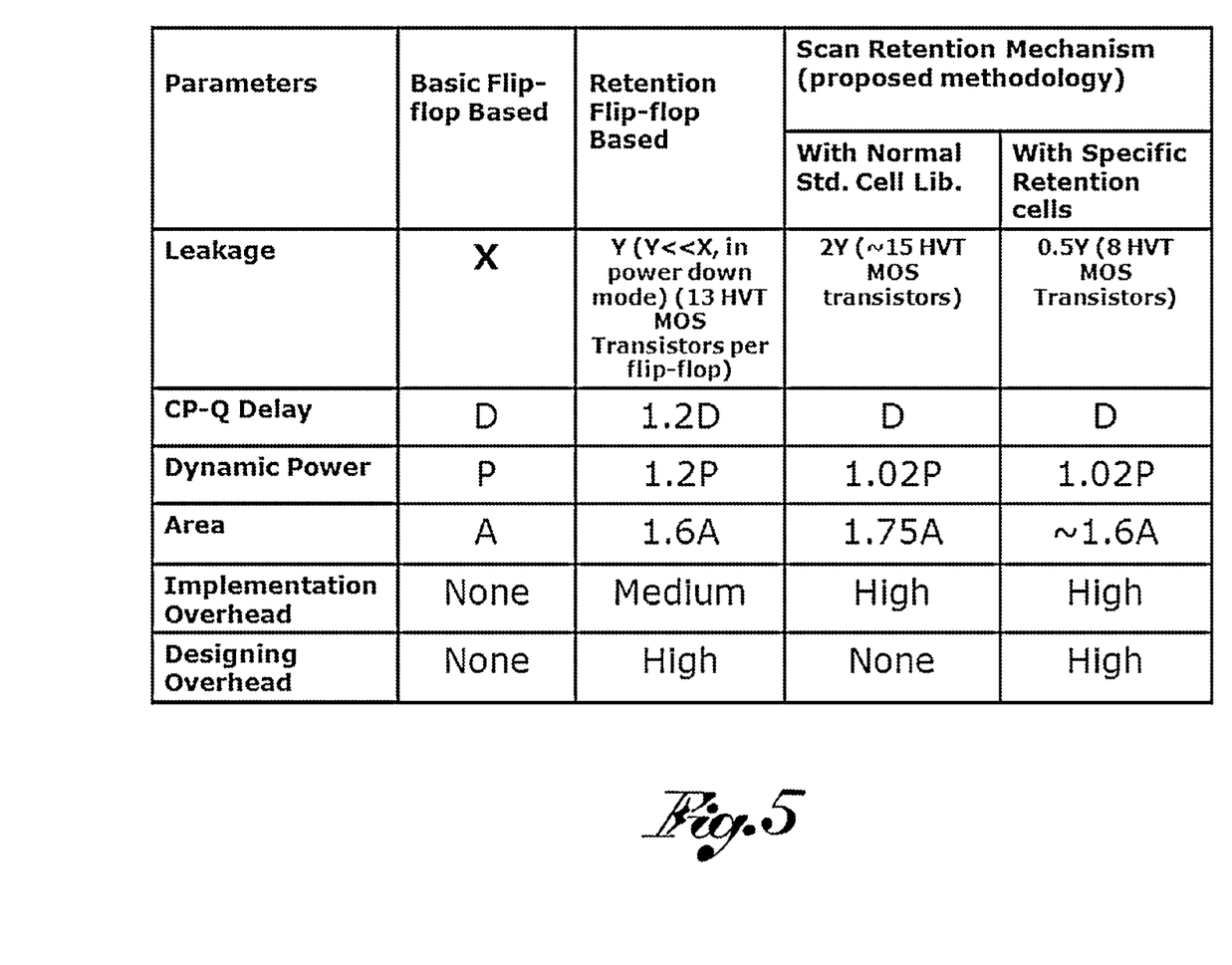
FIG. 5 is a comparative table of the characteristics of flip-flop circuits.

The advantages of the flip-flop circuit according to the disclosure are summarized in the comparative table in FIG. 5. The table uses as its parameters of comparison: static consumption, the speed (in terms of delay between the clock signal CP and the output Q of the flip-flop), dynamic consumption, the occupied area, the cost of the technique used to obtain a reduction of static consumption in stand-by in the application, and the relative design cost of the circuit.

A flip-flop circuit without data retention (first column), a flip-flop circuit with retention according to the known art (second column) and the flip-flop circuit according to the present disclosure, in the two embodiments with cell composed of standard components (third column) and with a specially designed cell (fourth column) were compared.

As regards static consumption (first line), indicating the consumption of a flip-flop circuit without data retention as X, the consumption of a circuit with retention according to the known art, for example comprising 13 high voltage threshold MOS transistors by Y, is much lower (Y<<X). The consumption of the circuit according to the disclosure, in the second embodiment with standard components (third column), comprising about 15 high voltage threshold MOS transistors, is about 2 Y, therefore double that of traditional retention flip-flops, but in any case still much less than the flip-flops without retention. The consumption of the circuit according to the disclosure, in the first embodiment with a specially designed cell, is actually about half that of traditional retention flip-flops, thanks to the reduced number (for example 8) of MOS HVT transistors.

As regards speed, if D is the delay from CP to Q in a flip-flop circuit without data retention, the delay in a circuit with retention according to the known art is about 20% higher, on account of the additional circuitry which slows down normal operation of the flip-flop. The delay in the circuit according to the disclosure, in both embodiments, is the same as the circuit without retention in that the retention cell does not interfere with normal operation of the flip-flop.

As regards dynamic consumption, the consumption of a flip-flop circuit without data retention being indicated as P, the consumption in a circuit with retention according to the known art is about 20% higher as a result of the addition of transistors to the circuital structure of the flip-flop. The dynamic consumption in the circuit according to the disclosure, in both embodiments, is however practically the same as the circuit without retention, in that the retention cell does not interfere with normal operation of the flip-flop.

As regards the occupied area, one may note how in the embodiment of the circuit according to the disclosure with a specially designed cell, the increase due to the presence of the retention circuit is essentially the same as that of a traditional flip-flop circuit with retention.

As regards design costs, it should be emphasized that the use of standard components for the realization of the retention cell according to the disclosure renders such costs practically null.

A person skilled in the art may make modifications, adaptations and replacements of elements with others functionally equivalent to the embodiments of the flip-flop circuit according to the disclosure so as to satisfy contingent and specific requirements while remaining within the sphere of protection of the following claims. Each of the characteristics described as belonging to a possible embodiment may be realized independently of the other embodiments described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A retention cell comprising:
a first input terminal configured to receive a first input data;
a second input terminal configured to receive a sleep command signal;
a third input terminal configured to receive a second input data;
a first supply terminal configured to receive a first supply voltage;
a second supply terminal configured to receive a second supply voltage that is larger than and independent of the first supply voltage;
a first output terminal;
a latch circuit electrically coupled with the first supply terminal and the second input terminal, the latch circuit being configured to be powered by the first supply voltage and to memorize a logic state corresponding to a last logic state present on the first input terminal upon receiving an assertion of the sleep command signal;
a pass through circuit electrically coupled with the first input terminal, the second input terminal, the second supply terminal, the first output terminal, and the latch circuit, the pass through circuit being configured to:
be powered by the second supply voltage,
transmit the first input data from the first input terminal to the first output terminal upon deassertion of the sleep command signal, and
inhibit transmission of the first input data from the first input terminal to the first output terminal during assertion of the sleep command signal; and
a transmission port electrically coupled with the third input terminal, the second supply terminal, and the first output terminal, the transmission port being configured to:

be powered by the second supply voltage,
transmit the second input data from the third input terminal to the first output terminal upon restoration of the second supply voltage to the retention cell during assertion of the sleep command signal, and
inhibit transmission of the second input data from the third input terminal to the first output terminal upon deassertion of the sleep command signal.

2. The retention cell as claimed in claim 1 wherein the pass through circuit is further configured to prevent transmission of the first input data from the first input terminal to the first output terminal upon removal of the second supply voltage during assertion of the sleep command signal.

3. The retention cell as claimed in claim 1 wherein the pass through circuit comprises:
a first tristate inverter having an input terminal electrically coupled with the first input terminal and an output terminal electrically coupled with the latch circuit, the first tristate inverter being configured to be powered by the second supply voltage and to prevent any transmission of a logic state from the input terminal to the output terminal upon removal of the second supply voltage during the assertion of the sleep command signal; and
a second tristate inverter having an input terminal electrically coupled with the latch circuit and an output terminal electrically coupled with the first output terminal, the second tristate inverter being configured to be powered by the second supply voltage and to prevent any transmission of the logic state from the input terminal to the output terminal upon removal of the second supply voltage during the assertion of the sleep command signal.

4. The retention cell as claimed in claim 3 wherein the first tristate inverter comprises:
first and second P-MOS transistors electrically coupled between the output terminal of the first tristate inverter and the second supply terminal, the first P-MOS transistor being configured to be controlled by the sleep command signal; and
first and second N-MOS transistors electrically coupled between the output terminal of the first tristate inverter and a zero logic terminal, the second N-MOS transistor being configured to be controlled by a negated sleep command signal, and
wherein the second tristate inverter comprises:
third and fourth P-MOS transistors electrically coupled between the output terminal of the second tristate inverter and the second supply terminal, the third P-MOS transistor being configured to be controlled by the sleep command signal; and
third and fourth N-MOS transistors electrically coupled between the output terminal of second tristate inverter and the zero logic terminal, the fourth N-MOS transistor being configured to be controlled by the negated sleep command signal.

5. The retention cell as claimed in claim 1 wherein the latch circuit comprises:
a first inverter having an input terminal and an output terminal, the input terminal electrically coupled with the pass through circuit; the first inverter being configured to be powered by the first supply voltage; and
a third tristate inverter having an input terminal and an output terminal, the input terminal electrically coupled with the output terminal of the first inverter and the output terminal electrically coupled with the pass through circuit, the third tristate inverter being configured to be powered by the first supply voltage and to invert and transmit a logic state from the input terminal to the output terminal upon the assertion of the sleep command signal, the third tristate inverter being further configured to prevent any transmission of the logic state present on the input terminal to the output terminal upon the deassertion of the sleep command signal.

6. The retention cell as claimed in claim 5 wherein the third tristate inverter comprises:
fifth and sixth P-MOS transistors electrically coupled between the output terminal of the third tristate inverter and the first supply terminal, the fifth P-MOS transistor being configured to be controlled by a negated sleep command signal; and
fifth and sixth N-MOS transistors electrically coupled between the output terminal of the third tristate inverter and a zero logic terminal, the sixth N-MOS transistor being configured to be controlled by the sleep command signal.

7. The retention cell as claimed in claim 1, further comprising:
a second output terminal; and
a transmit circuit electrically coupled with the latch circuit, the second supply terminal, and the second output terminal, the transmit circuit being configured to be powered by the second supply voltage and to invert and transmit the memorized logic state from the latch circuit to the second output terminal.

8. The retention cell as claimed in claim 1 wherein the transmission port comprises:
a fourth tristate inverter having an input terminal electrically coupled with the third input terminal and an output terminal coupled with the first output terminal, the fourth tristate inverter being configured to be powered by the second supply voltage and to transmit an inverted version of a logic state from the input terminal to the output terminal upon the return of the second supply voltage during the assertion of the sleep command signal.

9. The retention cell as claimed in claim 8 wherein the fourth tristate inverter comprises:
seventh and eighth P-MOS transistors electrically coupled between the output terminal of the fourth tristate inverter and the second supply terminal, the seventh P-MOS transistor being configured to be controlled by a negated sleep command signal; and
seventh and eighth N-MOS transistors electrically coupled between the output terminal of the fourth tristate inverter and a zero logic terminal, the eighth N-MOS transistor being configured to be controlled by the sleep command signal.

10. A flip flop circuit comprising:
a retention cell including:
a first input terminal configured to receive a first input data;
a second input terminal configured to receive a sleep command signal;
a third input terminal configured to receive a second input data;
a first supply terminal configured to receive the first supply voltage;
a second supply terminal configured to receive a second supply voltage that is larger than and independent of the first supply voltage;
a first output terminal;
a latch circuit electrically coupled with the first supply terminal and the second input terminal, the latch circuit being configured to be powered by the first supply voltage and to memorize a first logic state corresponding to a last logic state present on the first input terminal upon receiving an assertion of the sleep command signal;
a pass through circuit electrically coupled with the first input terminal, the second input terminal, the second supply terminal, the first output terminal, and the latch circuit, the pass through circuit being configured to:
be powered by the second supply voltage,
inhibit transmission of the first input data from the first input terminal to the first output terminal during an assertion of the sleep command signal, and
transmit the first input data from the first input terminal to the first output terminal upon a deassertion of the sleep command signal; and
a transmission port electrically coupled with the third input terminal, the second supply terminal, and the first output terminal, the transmission port being configured to
be powered by the second supply voltage,
transmit the second input data from the third input terminal to the first output terminal upon restoration of the second supply voltage to the retention cell during the assertion of the sleep command signal, and
inhibit transmission of the second input data from the third input terminal to the first output terminal upon the deassertion of the sleep command signal; and
a flip flop including:
a first supply terminal coupled with the second supply terminal of the retention cell,
a first input terminal configured to receive the second input data, and
a first output terminal coupled with the first input terminal of the retention cell, the flip flop being configured to be powered by the second supply voltage and to transmit the second input data from the first input terminal to first output terminal.

11. The circuit as claimed in claim 10 wherein the pass through circuit is further configured to prevent transmission of the first input data from the first input terminal of the retention cell to the first output terminal of the retention cell upon removal of the second supply voltage during the assertion of the sleep command signal.

12. The circuit as claimed in claim 10 wherein the pass through circuit comprises:
a first tristate inverter having an input terminal electrically coupled with the first input terminal of the retention cell and an output terminal coupled with the latch circuit, the first tristate inverter being configured to be powered by the second supply voltage and to prevent any transmission of a logic state from the input terminal to the output terminal upon a removal of the second supply voltage during the assertion of the sleep command signal; and
a second tristate inverter having an input terminal coupled with the latch circuit and an output terminal coupled with the first output terminal of the retention cell, the second tristate inverter being configured to be powered by the second supply voltage and to prevent any transmission of a logic state from the input terminal to the output terminal upon the removal of the second supply voltage during the assertion of the sleep command signal.

13. The circuit as claimed in claim 12 wherein the first tristate inverter comprises:
first and second P-MOS transistors electrically coupled between the output terminal of the first tristate inverter and the second supply terminal, the first P-MOS transistor being configured to be controlled by the sleep command signal; and
first and second N-MOS transistors electrically coupled between the output terminal of the first tristate inverter and a zero logic terminal, the second N-MOS transistor being configured to be controlled by a negated sleep command signal, and
wherein the second tristate inverter comprises:
third and fourth P-MOS transistors electrically coupled between the output terminal of the second tristate inverter and the second supply terminal, the third P-MOS transistor being configured to be controlled by the sleep command signal; and
third and fourth N-MOS transistors electrically coupled between the output terminal of the second tristate inverter and the zero logic terminal, the fourth N-MOS transistor being configured to be controlled by the negated sleep command signal.

14. The circuit as claimed in claim 10 wherein the retention cell further comprises:
a second output terminal; and
a transmit circuit electrically coupled with the latch circuit and to the second output terminal, the transmit circuit being configured to be powered by the second supply voltage and to invert and transmit a memorized first logic state from the latch circuit to the second output terminal.

15. The circuit as claimed in claim 10 wherein the latch circuit comprises
a first inverter having an input terminal and an output terminal, the input terminal electrically coupled with the pass through circuit; the first inverter being configured to be powered by the first supply voltage; and
a third tristate inverter having an input terminal and an output terminal, the input terminal electrically coupled with the output terminal of the first inverter and the output terminal coupled with the pass through circuit, the third tristate inverter being configured to be powered by the first supply voltage and to invert and transmit a logic state from the input terminal to the output terminal upon the assertion of the sleep command signal, the fourth state inverter being further configured to prevent any transmission of a logic state from the input terminal to the output terminal upon a deassertion of the sleep command signal.

16. The circuit as claimed in claim 15 wherein the third tristate inverter comprises:
fifth and sixth P-MOS transistors electrically coupled between the output terminal of the third tristate inverter and the first supply terminal, the fifth P-MOS transistor being configured to be controlled by a negated sleep command signal; and
fifth and sixth N-MOS transistors electrically coupled between the output terminal of the third tristate inverter and a zero logic terminal, the sixth N-MOS transistor being configured to be controlled by the sleep command signal.

17. A method for data retention in a retention cell, the method comprising:
receiving a first voltage supply at a latch circuit;
receiving a second voltage supply at a pass through circuit, a transmit circuit, and a transmission port;
transmitting a first data from a first input terminal of the retention cell to a first output terminal of the retention cell through the pass through circuit;

in response to assertion of a sleep command signal at a second input terminal of the retention cell:
   memorizing a logic state at the first input terminal in the latch circuit, and
   inhibiting transmission through the pass through circuit to the first output terminal;
in response to removal of the second voltage supply from the transmission port during assertion of the sleep command signal, inhibiting transmission through the transmission port to the first output terminal; and
in response to restoration of the second voltage supply to the retention cell during assertion of the sleep command signal,
   transmitting a second input data from a third input terminal of the retention cell to the first output terminal of the retention cell.

18. The method for data retention in a retention cell as claimed in claim 17, further comprising:
in response deassertion of the sleep command signal subsequent to restoration of the second voltage supply to the transmission port, inhibiting transmission of data input through the transmission port to the first output terminal.

19. The method for data retention in a retention cell as claimed in claim 17, further comprising:
in response to deassertion of the sleep command signal, inhibiting memorizing of a logic state at the first input terminal in the latch circuit.

20. The method for data retention in a retention cell as claimed in claim 19, further comprising:
in response to restoration of the second voltage supply to the transmit circuit during assertion of the sleep command signal, inverting and transmitting the memorized logic state in the latch circuit to a second output terminal of the retention cell.

21. The method as claimed in claim 19, further comprising:
in response to restoration of the second voltage supply to the pass through circuit, transmitting data input from a first input terminal of the retention cell to a first output terminal of the retention cell through the pass through circuit.

22. A retention cell comprising:
a first input terminal configured to receive an input data;
a second input terminal configured to receive a sleep command signal;
a first supply terminal configured to receive a first supply voltage;
a second supply terminal configured to receive a second supply voltage that is larger than and independent of the first supply voltage;
a first output terminal;
a latch circuit electrically coupled with the first supply terminal and the second input terminal, the latch circuit being configured to be powered by the first supply voltage and to memorize a logic state corresponding to a last logic state present on the first input terminal upon receiving an assertion of the sleep command signal; and
a pass through circuit electrically coupled with the first input terminal, the second input terminal, the second supply terminal, the first output terminal, and the latch circuit, the pass through circuit being configured to be powered by the second supply voltage and to transmit the input data from the first input terminal to the first output terminal, wherein the pass through circuit comprises:
a first tristate inverter having an input terminal electrically coupled with the first input terminal and an output terminal electrically coupled with the latch circuit, the first tristate inverter being configured to be powered by the second supply voltage and to prevent any transmission of a logic state from the input terminal to the output terminal upon removal of the second supply voltage during the assertion of the sleep command signal; and
a second tristate inverter having an input terminal electrically coupled with the latch circuit and an output terminal electrically coupled with the first output terminal, the second tristate inverter being configured to be powered by the second supply voltage and to prevent any transmission of the logic state from the input terminal to the output terminal upon removal of the second supply voltage during the assertion of the sleep command signal.

23. The retention cell as claimed in claim 22, wherein:
the first tristate inverter comprises:
   first and second P-MOS transistors electrically coupled between the output terminal of the first tristate inverter and the second supply terminal, the first P-MOS transistor being configured to be controlled by the sleep command signal; and
   first and second N-MOS transistors electrically coupled between the output terminal of the first tristate inverter and a zero logic terminal, the second N-MOS transistor being configured to be controlled by a negated sleep command signal, and
the second tristate inverter comprises:
   third and fourth P-MOS transistors electrically coupled between the output terminal of the second tristate inverter and the second supply terminal, the third P-MOS transistor being configured to be controlled by the sleep command signal; and
   third and fourth N-MOS transistors electrically coupled between the output terminal of second tristate inverter and the zero logic terminal, the fourth N-MOS transistor being configured to be controlled by the negated sleep command signal.

24. A flip flop circuit comprising:
a retention cell including:
   a first input terminal configured to receive an first input data;
   a second input terminal configured to receive a sleep command signal;
   a first supply terminal configured to receive the first supply voltage;
   a second supply terminal configured to receive a second supply voltage that is larger than and independent of the first supply voltage;
   a first output terminal;
   a latch circuit electrically coupled with the first supply terminal and the second input terminal, the latch circuit being configured to be powered by the second supply voltage and to memorize a first logic state corresponding to a last logic state present on the first input terminal upon receiving an assertion of the sleep command signal; and
   a pass through circuit electrically coupled with the first input terminal, the second input terminal, the second supply terminal, the first output terminal, and the latch circuit, the pass through circuit being configured to be powered by the second supply voltage and to transmit the input data from the first input terminal to the first output terminal; and
a flip flop including:
   a first supply terminal coupled with the second supply terminal of the retention cell,
   a first input terminal configured to receive a second input data, and a first output terminal coupled with the first input terminal of the retention cell, the flip flop being configured to be powered by the second supply voltage and to transmit the second input data from the first input terminal to first output terminal, wherein the pass through circuit comprises:
  a first tristate inverter having an input terminal electrically coupled with the first input terminal of the retention cell and an output terminal coupled with the latch circuit, the first tristate inverter being configured to be powered by the second supply voltage and to prevent any transmission of a logic state from the input terminal to the output terminal upon a removal of the second supply voltage during the assertion of the sleep command signal; and
  a second tristate inverter having an input terminal coupled with the latch circuit and an output terminal coupled with the first output terminal of the retention cell, the second tristate inverter being configured to be powered by the second supply voltage and to prevent any transmission of a logic state from the input terminal to the output terminal upon the removal of the second supply voltage during the assertion of the sleep command signal.

25. The circuit as claimed in claim 24, wherein:
the first tristate inverter comprises:
  first and second P-MOS transistors electrically coupled between the output terminal of the first tristate inverter and the second supply terminal, the first P-MOS transistor being configured to be controlled by the sleep command signal; and
  first and second N-MOS transistors electrically coupled between the output terminal of the first tristate inverter and a zero logic terminal, the second N-MOS transistor being configured to be controlled by a negated sleep command signal, and
the second tristate inverter comprises:
  third and fourth P-MOS transistors electrically coupled between the output terminal of the second tristate inverter and the second supply terminal, the third P-MOS transistor being configured to be controlled by the sleep command signal; and
  third and fourth N-MOS transistors electrically coupled between the output terminal of the second tristate inverter and the zero logic terminal, the fourth N-MOS transistor being configured to be controlled by the negated sleep command signal.

* * * * *